United States Patent [19]

Keshtbod

[11] Patent Number: 5,479,368
[45] Date of Patent: Dec. 26, 1995

[54] SPACER FLASH CELL DEVICE WITH VERTICALLY ORIENTED FLOATING GATE

[75] Inventor: Parviz Keshtbod, Los Altos Hills, Calif.

[73] Assignee: Cirrus Logic, Inc., Freemont, Calif.

[21] Appl. No.: 129,866

[22] Filed: Sep. 30, 1993

[51] Int. Cl.$^6$ .................................................. G11C 16/04
[52] U.S. Cl. .................... 365/185.01; 257/316; 257/318; 257/319; 257/321
[58] Field of Search ........................... 365/185; 257/315, 257/316, 319, 320, 321, 324, 326, 318

[56] References Cited

U.S. PATENT DOCUMENTS

| | | | |
|---|---|---|---|
| 4,122,544 | 10/1978 | McElroy | 365/185 |
| 4,203,158 | 5/1980 | Frohman-Bentchkowsky et al. | 365/185 |
| 4,274,012 | 6/1981 | Simko | 307/238.3 |
| 4,295,265 | 10/1981 | Horiuchi et al. | 29/571 |
| 4,332,077 | 6/1982 | Hsu | 29/571 |
| 4,366,555 | 12/1982 | Hu | 365/185 |
| 4,412,311 | 10/1983 | Miccoli et al. | 365/185 |
| 4,462,089 | 7/1984 | Miida et al. | 365/185 |
| 4,471,373 | 9/1984 | Shimizu et al. | 357/41 |
| 4,599,706 | 7/1986 | Guteman | 365/185 |
| 4,622,737 | 11/1986 | Ravaglia | 29/571 |
| 4,727,043 | 2/1988 | Matsumoto et al. | 437/29 |
| 4,754,320 | 6/1988 | Mizutani et al. | 365/185 |
| 4,814,286 | 3/1989 | Tam | 437/27 |
| 4,822,750 | 4/1989 | Perlegos et al. | 437/52 |
| 4,853,895 | 8/1989 | Mitchell et al. | 365/185 |
| 4,912,676 | 3/1990 | Paterson et al. | 365/185 |
| 4,964,143 | 10/1990 | Haskell | 357/23.5 |
| 5,019,879 | 5/1991 | Chiu | 365/185 |
| 5,029,130 | 7/1991 | Yeh | 365/185 |
| 5,045,488 | 9/1991 | Yeh | 437/43 |
| 5,067,108 | 11/1991 | Jenq | 365/185 |
| 5,187,483 | 2/1993 | Yonemaru | 341/156 |
| 5,240,870 | 8/1993 | Bergemont | 437/43 |
| 5,241,507 | 8/1993 | Fong | 365/218 |
| 5,252,847 | 10/1993 | Arima et al. | 257/320 |
| 5,256,584 | 10/1993 | Hartmann | 437/43 |
| 5,270,562 | 12/1993 | Wuidart | 257/315 |
| 5,293,328 | 3/1994 | Amin et al. | 365/185 |

OTHER PUBLICATIONS

H. G. Dill and T. N. Toombs, "A New MNOS Charge Storage Effect," Solid–State Electronics, vol. 12, pp. 981–987, Pergamon Press 1969.

Primary Examiner—Joseph E. Clawson, Jr.
Attorney, Agent, or Firm—Haverstock & Associates

[57] ABSTRACT

A flash EPROM cell has a reduced cell size by providing vertical coupling between the floating gate and the bit line during programming. The erase operation is done by tunneling of electrons from the sharp tip of the Poly spacer to the control gate. The cell is adapted so that the source for each cell within the array is the source of an adjacent cell and the drain is the drain to another adjacent cell. The cell is formed by forming the drain regions into the substrate through openings in a first insulator that is preferably the field oxide. A second insulator is deposited over the first insulator, over the substrate and along the side walls of the openings and is preferably a thin layer so that the opening is covered with a thin insulating layer. The insulated opening is filled with a first doped polysilicon layer. The field oxide is selectively removed. A gate oxide is grown and a second polysilicon layer is formed and then etched to form spacers along the edges of the first polysilicon/second insulator structure. The second polysilicon is selectively etched and a tunneling insulator layer is formed thereover. A third polysilicon layer is formed over the tunneling insulator.

16 Claims, 7 Drawing Sheets

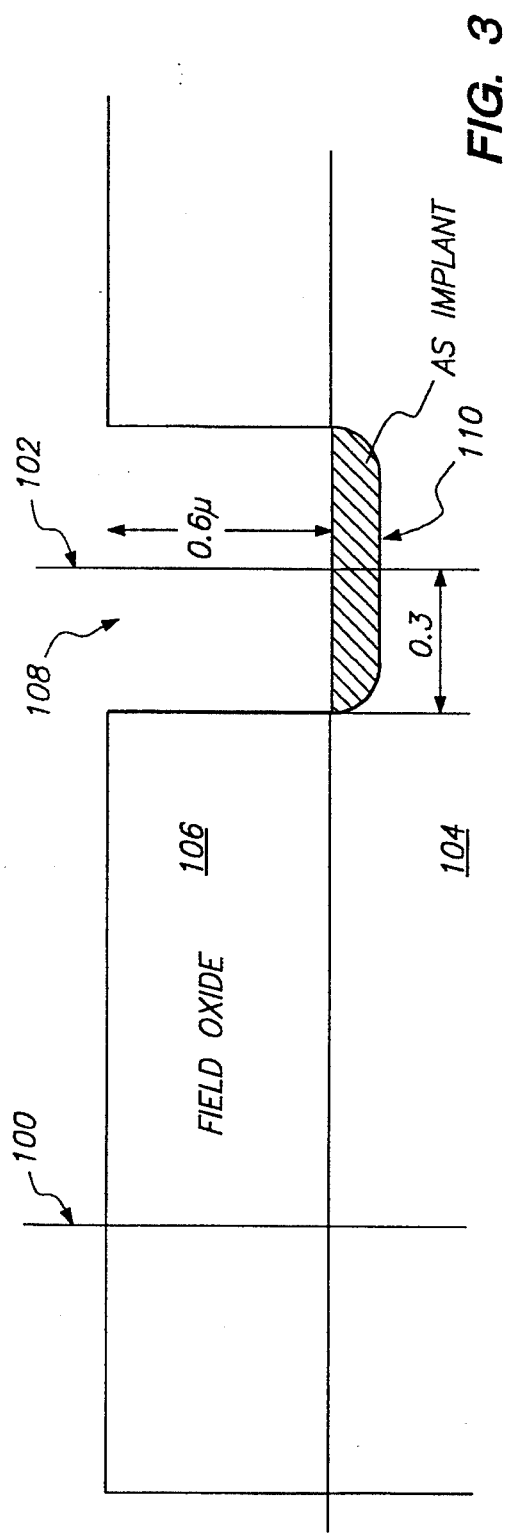
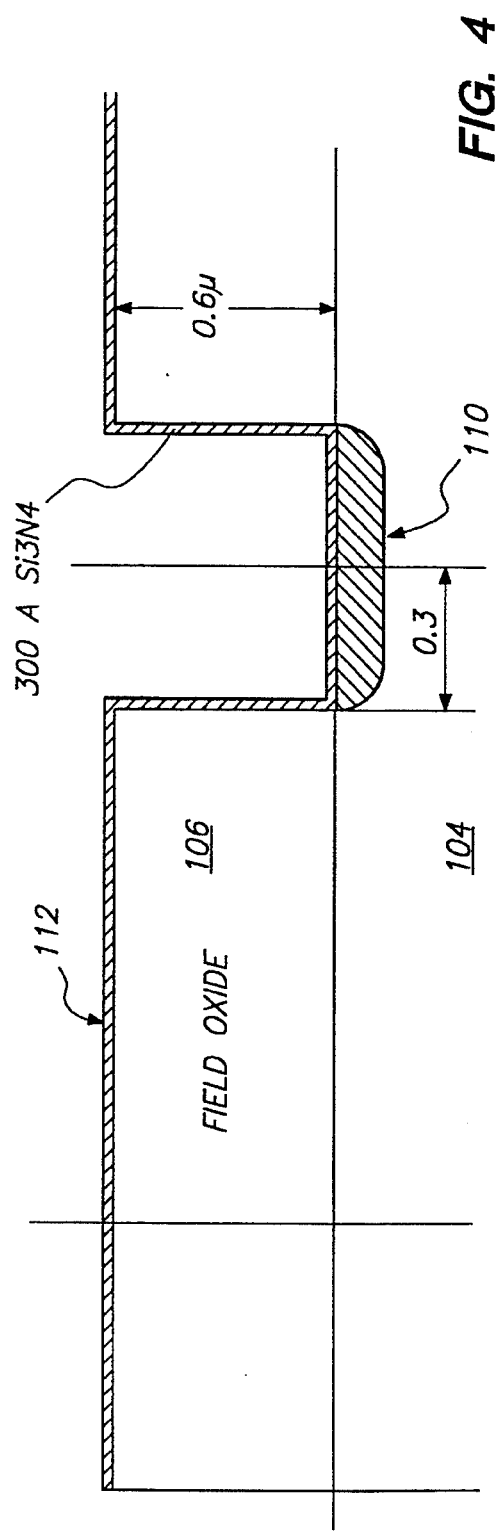

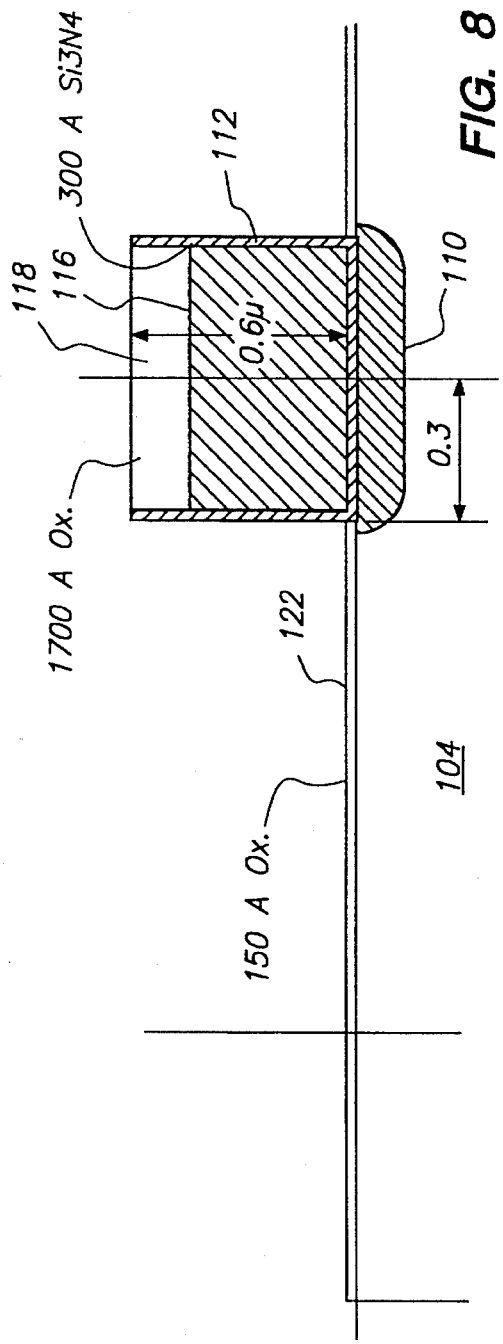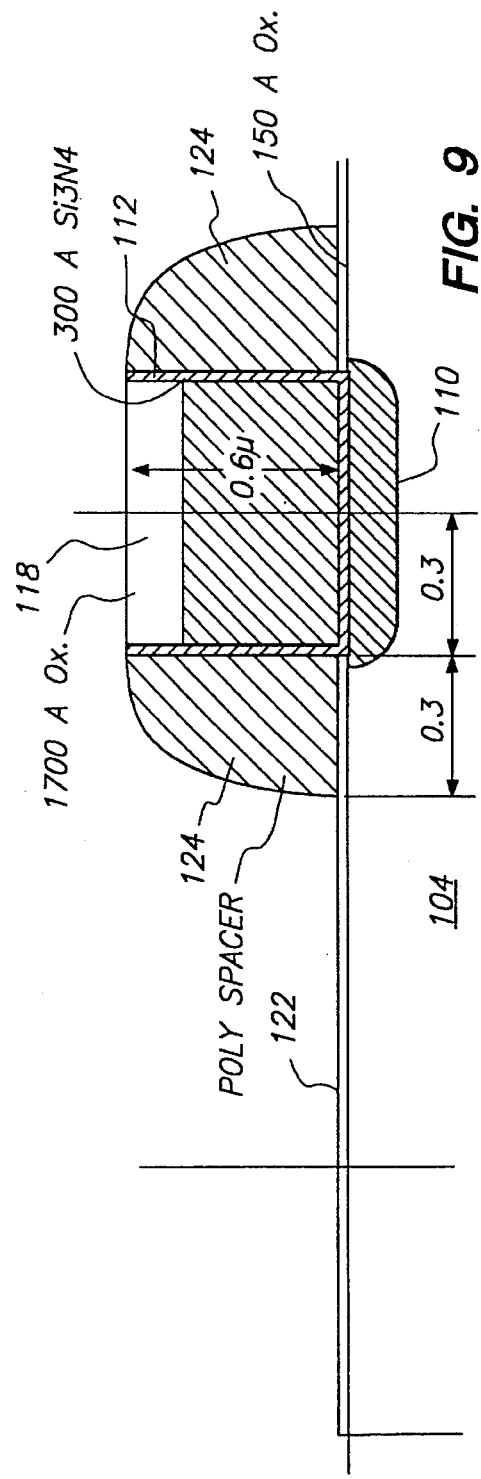

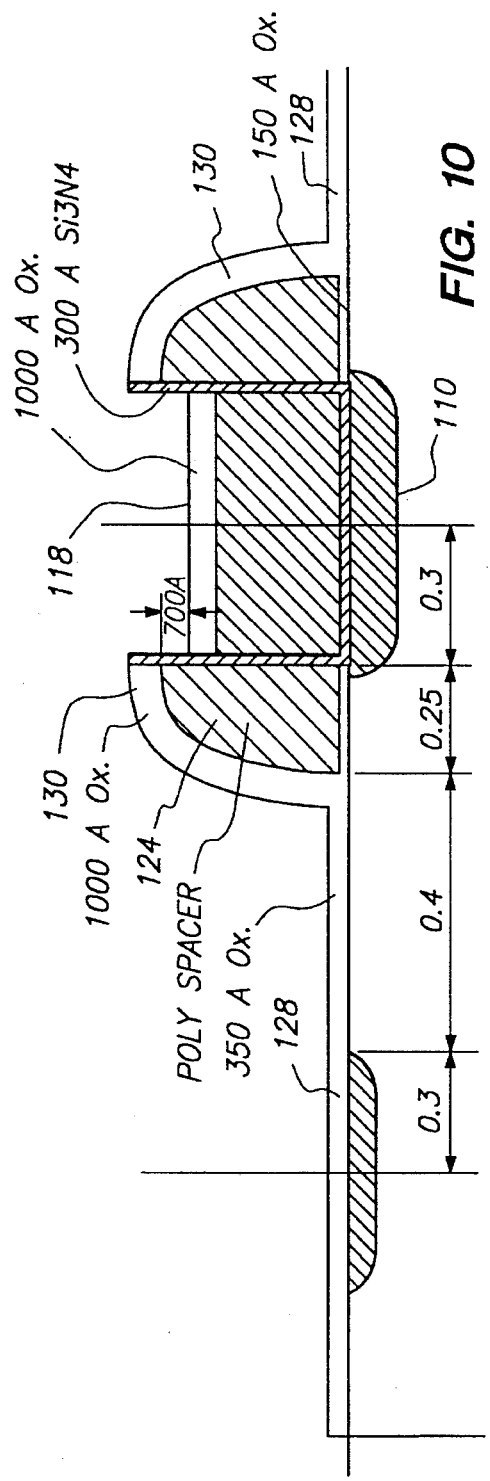
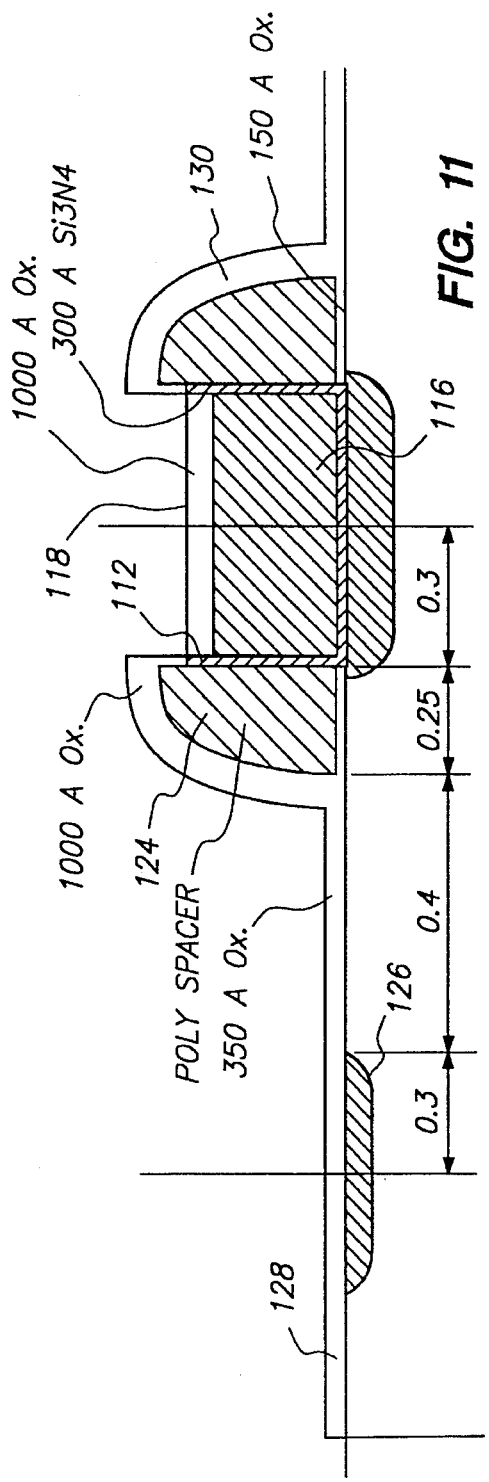

SPACER FLASH CELL DEVICE WITH VERTICALLY ORIENTED FLOATING GATE

FIELD OF THE INVENTION

This invention relates to the field of processes for manufacturing semiconductor electronic devices. More particularly, this invention relates to a process for forming flash EPROM memory cells using a spacer technology.

BACKGROUND OF THE INVENTION

The non-volatile electrically programmable and erasable memory devices sometimes referred to as Flash devices are explained in a variety of operations in the prior art. The section of this group called EEPROMs generally include two serially connected N-channel metal oxide semiconductor transistors, in which one of the transistors has an additional control gate that is floating and is sandwiched between the gate and the channel. This gate is used to store positive or negative charges which determine the state of the EEPROM. The other transistor is used for selection purposes. The charging of the floating gate is done by Fowler-Nordheim tunneling of electrons out of or into the floating gate. The oxide layer between the channel and the floating gate is around 100 Å as reported in the prior art. These conventional flash devices require high voltages, are slow for programming and they occupy a large space due to the large capacitive coupling that is required between the floating gate and the control gate.

Another type of flash device as reported in (Intel flash patent) utilizes a single N-MOS transistor with a floating gate inserted between the control gate and the channel of the device. The oxide thickness for these type of flash cells is also around 100 Å. The storing of the negative charge into the floating gate is achieved by injection of high energy electrons generated in the channel during charge transport between the source and the drain of the transistor. This requires a much lower voltage on the control gate but requires a larger source to drain current. The erase or removal of the negative charge is done exactly like the EEPROM cell with the exception that it should be performed under control to prevent over erasing of the cell, which leaves positive charge on the floating gate so that the transistor will remain "on" all the time and the cell selectivity will be lost. This type of flash cell which is smaller than the EEPROM cell and requires lower programming voltage but suffers from over erase and high current requirements. The high current requirements for this type of flash cell make it unsuitable for applications that use a battery as its power source. A further complication in this type of flash cell comes from the control of the erase voltage Vt. Since over erase has to be avoided for all the cells in the memory, the lower limit for the Vt of the erased cell can not be less than 0.5 V. Since all the cells do not erase the same way, there can be cells in the memory with Vt as high as 3.0 volts. A Vt of 3.0 V makes it impossible to operate the cell with 3 volts as a control voltage on the gate.

BRIEF DESCRIPTION OF THE DRAWINGS

FIGS. 3–11 show cross sections of the semiconductor device of FIG. 1 after the various stages of the steps of a process that embody the present invention.

BRIEF DESCRIPTION OF THE TABLE

Figure 1:
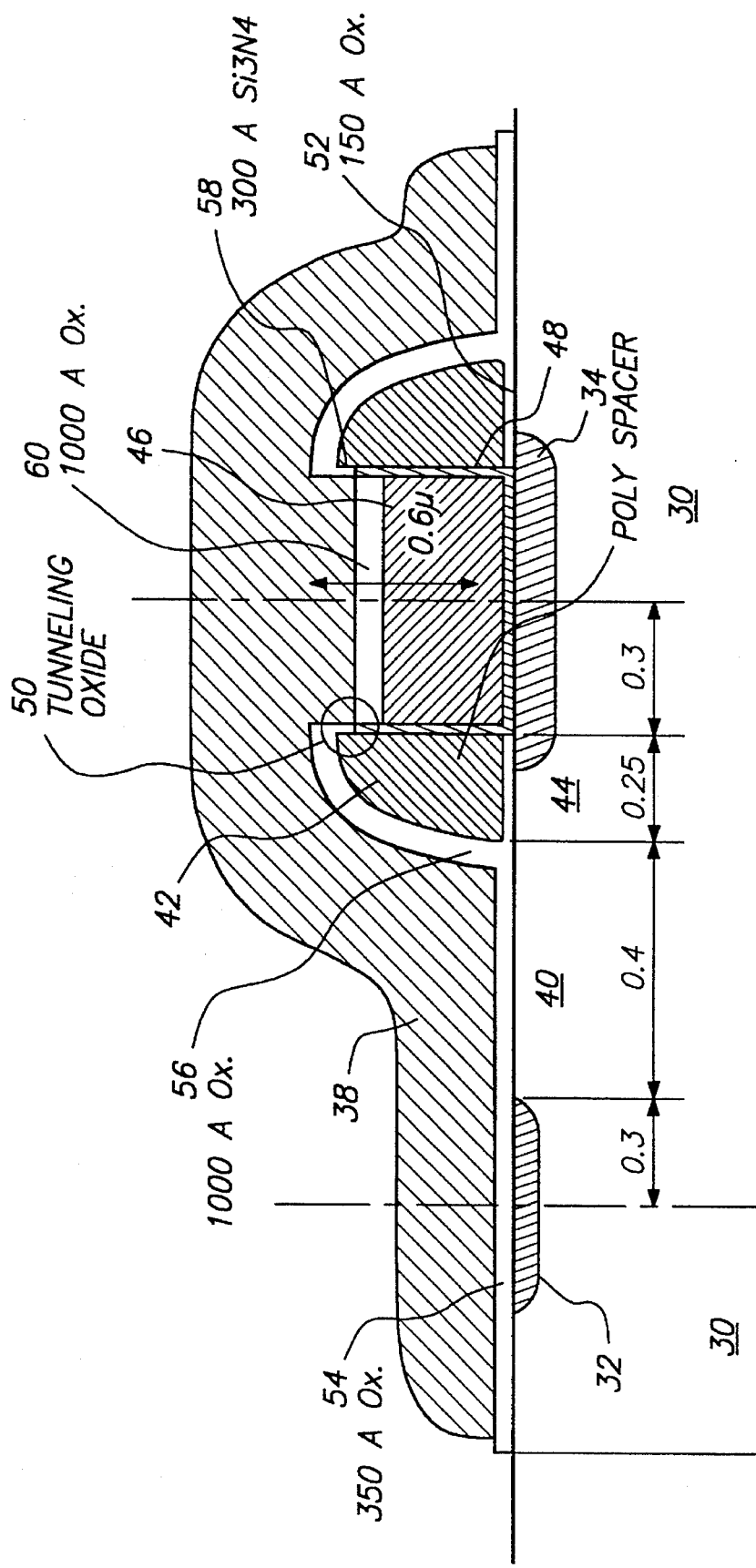
FIG. 1 shows a cross section diagram of a cell manufactured according to the present invention.

Table I depicts a manufacturing process for building a flash EPROM cell according to the present invention.

SUMMARY OF THE INVENTION

A flash cell is disclosed which uses a floating polysilicon spacer as a storage element. A silicon nitride layer is preferably used as the coupling medium between the cell bit line and the floating storage element. The bit line of the cell is formed by filling a trench formed in field oxide with doped polysilicon and then removing the field oxide in the cell area. The silicon nitride insulating layer has a higher coupling between the bit line and the floating storage element due to a higher dielectric constant as compared to silicon dioxide layers which are used in the prior art for coupling floating gates to control elements.

The storage element forms a floating gate transistor which is in series with the control transistor. The gate of the control transistor is separated from the storage element by a thick oxide layer. This layer reduces the coupling between the floating gate and the control gate in contrast to the prior art (Intel patent) which uses a silicon nitride/oxide layer to maximize the coupling. The low coupling between the control gate and the floating gate keeps the floating gate transistor "off" with a very small amount of negative charge on the floating gate which makes the Flash cell of the present invention program quickly with low voltage requirements on the drain and bit line.

An erase operation is done through a thin oxide grown on the floating gate storage element. To grow this thin oxide layer, a small portion of the silicon nitride on the side of the floating gate is removed and then the thin oxide layer is grown. The electrons trapped in the floating gate will tunnel through this thin oxide layer due to the application of a high voltage on the control gate while the other electrodes are grounded. It is preferred to tunnel excess electrons from the floating gate to leave it positively charged. This is in contrast to the prior art (Intel patent) which teaches away from this phenomenon called over erase. The control gate and the drain of the cell are not connected together. During all programming operations, the control gate and the drain are connected to a high voltage on the order of 10–12 V. During a read operation the drain is coupled to a low voltage of around 2 V. The bit line voltage can be zero or 2 V. Connecting the bit line to zero volt reduces the voltage coupled to the floating gate and therefore reduces the negative voltage requirement on the floating gate to keep the cell off even further. Note that this would make the design of the cell more complex.

DETAILED DESCRIPTION OF THE PREFERRED EMBODIMENT

The present invention is preferably directed toward a CMOS process and will be so described. However, it will be apparent to a person of ordinary skill in the art that the principle features of the present invention can be applied equally well to NMOS or PMOS processes. Additionally, it will be understood that the present invention can be applied to EPROM technology.

The cell structure

The cell of the preferred embodiment is shown in FIG. 1. The cell is formed on a p-type semiconductor substrate 30. The cell includes a drain 34, a source 32, a channel 40 of the control transistor and a channel 44 of the cell's floating gate transistor. The drain 34 is shared with the cell located to the right of the illustrated cell and the source 32 is shared with the cell located to the left of the illustrated cell. The floating gate 42 is capacitively coupled to the bit line 46 via the insulator 48.

The floating gate 42 and the .channel 44 form the floating gate transistor that determines the status of the cell. Negative charge that is stored in the floating gate cuts off the current flow in the channel 44, this is called the "off" state of the cell. Positive charge on the floating gate keeps the floating gate transistor conducting current which is called the "on" state of the cell. The control gate 38 and channel 40 form the control transistor that is used for cell selection.

The insulating oxide layer 56 is formed between the floating gate 42 and the control gate 38. The thickness of this oxide layer 56 is preferred to be more than 1000 Å to minimize the capacitive coupling between the floating gate 42 and the control gate 38 to insure independent operation of the control transistor and the floating gate transistor.

The bit line 46 is formed by filling a trench with preferably polysilicon. The polysilicon fill 48 is recessed to allow etching of a small portion of the silicon nitride insulator 58. A thin oxide layer 50 around 120 to 200 Å thick is grown on the floating gate 42 in the region that silicon nitride layer was removed. The floating gate 42 is formed of a polysilicon spacer. This polysilicon spacer which is formed by etching of a polysilicon layer deposited on a step formed by the bit line will have a sharp corner on top. This sharp corner will enhance the electric field in the thin oxide layer 50 which helps to reduce the erase time and erase voltage required.

Figure 2:
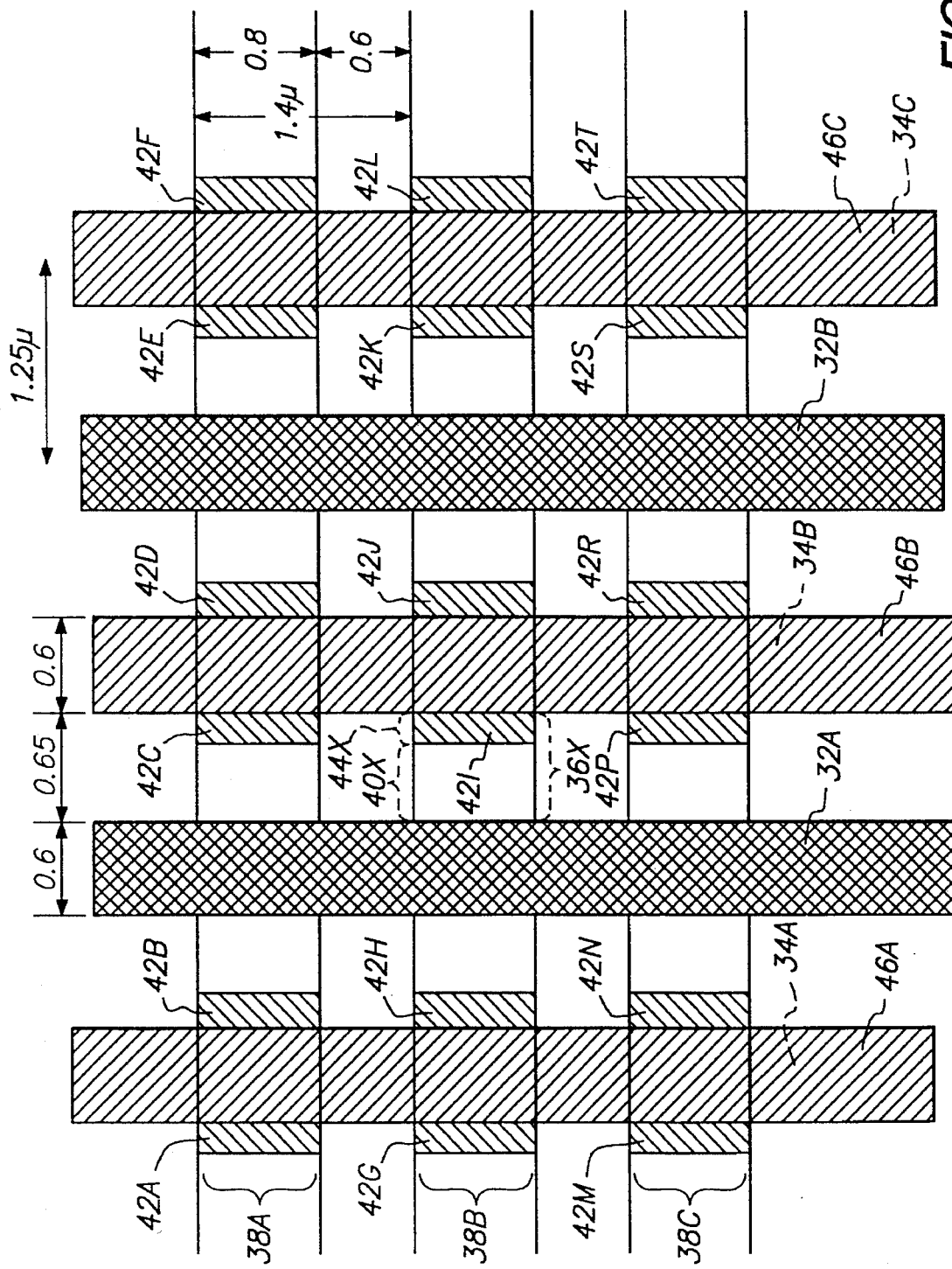
FIG. 2 shows a geometric layout for a portion of a memory array manufactured according to the present invention.

FIG. 2 shows a plan view of a portion of an array of cells such as that shown in FIG. 1. Because there are more than one of each of the elements of FIG. 1, those shown in FIG. 2 will be labeled with alpha suffixes to distinguish between the various similar elements. Twelve complete cells and six partial cells are shown. It will be understood by a person of ordinary skill in the art that a drain 34X is formed under each bit line 46X and is thus obscured in the drawing of FIG. 2. According to the reference numerals for the drains 34X are shown as ghosts.

One cell will be identified. A source 32A and its drain 34B are coupled to one another via a channel 36X. A control gate 38B is coupled to control a portion 40X of the channel 36X. A floating gate 42I is configured to control a second portion of the channel 44X. By applying an appropriate voltage signal to the control gate 38A the channel 36X will provide a path for current flow from the source to the drain depending upon whether or not the floating gate 42I has been programmed.

Cell Operation

The operation of the cell is described with reference to the cell illustrated in FIG. 1. It will be readily understood by a person of ordinary skill in the art that these voltages can be applied to one or more additional cells sequentially or in parallel with these signals for a single cell depending upon the system performance requirements.

Programming A Cell

To program a cell a voltage on the order of 10 to 12 volts is applied to the drain 34 and the bit line 46 of the cell. The bit line 46 and floating gate 42 are relatively strongly capacitively coupled to each other. The capacitive coupling factor between these electrodes is preferably about 0.75. Thus, with the application of 10 to 12 V on the bit line 46 and the drain 34, 8 to 9.6 V will appear on the floating gate 42. At the same time the source 32 is connected to ground and the control gate 38 is connected to 1.5 to 2 V. This voltage is 0.5 to 1 V larger than the threshold voltage of the control transistor.

Under such conditions the channel 40 is inverted and channel 44 is very strongly inverted. This is especially true since the threshold of the floating gate transistor is close to zero, and a high voltage (8 to 9.6 V) is on the floating gate 42. The gap between the channels 40 and 44 is weakly inverted by fringing fields of the gates 38 and 42. Due to high drain and low gate voltage on the control gate 38 the electrons entering the channel 40 from the source 32, accelerate toward the channel 44 under the high horizontal electric field. The electric field is especially high in the gap between channels 44 and 40. This is due to a weak inversion in this region which results in a small number of electrons carrying the current, and since the total current is constant from the source 32 and the drain 44 the electrons have to move faster in a higher electric field. Some of these fast moving electrons are injected into the floating gate that has the highest potential. As electrons are injected into the floating gate, its potential drops to the point that the channel region 44 cannot maintain inversion. At this time, the current decreases to zero and programming of the cell stops. Since a slowdown in programming happens gradually, a user need not wait for the channel to completely cut off, but can stop the programming operation when the voltage on the floating gate 42 drops approximately 3 to 4 V. It will be apparent to some one of ordinary skill in the art that at a higher potential on the bit line 46 and the drain 34 this change will happen in shorter time. With the removal of the programming voltages on the bit line 46 and the drain 34, approximately 3 to 4 volts of negative charge will be trapped on the floating gate 42 which prevents the channel 44 from inverting.

Reading a Cell

To read a cell the source 32 is connected to the ground potential, the drain 34 (and with the discretion of the user the bit line 46) is connected to 1 to 1.5 V, and the control gate 38 to 3 to 5 V. The capacitive coupling factor between control gate 38 and the floating gate 42 is very small; on the order of 0.1 to 0.15 and preferably 0.10. Under these conditions the total voltage coupled to the floating gate 42 will be 1.1 to 1.95 volts. In an erased cell the floating gate usually has positive charge due to an over erase condition that happens naturally. Over erase is not required for the operation-of the cell but during an erase cycle it usually happens and no effort will be put into preventing it. In any case, the threshold of the floating gate transistor with the channel 44 is either zero or negative, and the channel 44 will be inverted with proper read voltages applied to proper cell elements. The channel 40 of the control transistor is also inverted due to the application of 3 to 5 V to the control gate 38. This causes the current to flow from the drain 34 to the source 32.

In a programmed cell the negative charge that is stored on the floating gate 42 exceeds the capacitively coupled positive charges from the control gate 38 and the bit line 46, so that the channel 44 cannot become inverted, thereby preventing current flow from the drain 34 to the source 32. During a read operation the bit line 46 can be coupled to ground while the drain 34 is connected to 1 to 1.5 V. This reduces the amount of coupled charge to the floating gate 42 to an even lower value, which means that the cell needs even less negative charge on the floating gate during programming, which translates into even faster programming with lower drain 34 and bit line 46 voltages.

Erasing a Cell

The cell erase operation is done by application of a voltage to the control gate 38 while the other electrodes are at ground potential. The voltage required depends on the erase speed requirement, faster speed requires higher voltage on the control gate. A typical erase voltage is around 12 to 15 V for the cell of the present invention. During an erase cycle the charges that are trapped in the floating gate 42 tunnel through the tunneling oxide layer 50 to leave the floating gate 42, thereby increasing the potential on the floating gate 42.

As the potential on the floating gate 42 rises, the difference between the floating gate voltage and the control gate voltage becomes less and less which slows the tunnelling process. This means that the erasure of an unprogrammed cell would not harm the cell since a positive voltage on the floating gate 42 would build up faster and erasure stops sooner than for a programmed cell. In this operation all the cells sharing the same common control gate 38 will erase. This is called a sector erase operation in prior art, since all the cells containing one sector worth of data have a common control gate. Selective cell erase operation is possible by application of proper voltage to the bit lines and drains of the cells that are preferred to stay programmed.

The Preferred Process for Forming the Flash Cell in Combination with a CMOS Process This patent document also discloses the art of making a Flash cell of the present invention by adding process steps to a conventional CMOS process such as those known to a person skilled in the semiconductor prior art. The process for the preferred embodiment is outlined in Table 1, which uses many process steps commonly found in a conventional N-Well CMOS process.

After the wafer is processed through an N-well process, diffusion masking and appropriate etches, and field oxidation, a polysilicon bit line mask is used to make deep trenches in the field oxide. The trenches are etched all the way to the silicon substrate. Arsenic is then implanted into the trenches to form the drain of the cell. A thin layer of silicon nitride on the order of 300 to 500 Å is then deposited over the entire wafer covering the field oxide and the bottom and side walls of all the trenches, insulating the bit lines from the drains of the cells.

A buried contact mask can be used to connect the bit lines to the drains of the cells. This is optional and one could use other means of connecting the two together, as an example metal and contacts. The trenches are then filled with polysilicon. This is done by covering the wafer with polysilicon. The polysilicon layer is doped with phosphorous and is etched back to leave polysilicon only in the trenches and thereby fill the trenches to the top. The silicon nitride which covers the face of the wafer is also removed during this process.

At this point in the process (step X in Table 1) an oxide layer is grown on the wafer to consume some of the polysilicon in the trench. The oxide layer is preferably 1000 Å. After this oxidation step the silicon nitride that was used to define the active area is removed as is known in the prior art. In step XI a mask is used to selectively remove the field oxide in the cell areas, this causes the poly filled trenches to stand out with silicon nitride covering their sides.

A sacrificial oxide of 850 Å is grown on the single crystalline silicon substrate and then etched back. Since the polysilicon is heavily doped with phosphorous, about 2600 Å A of oxide grows on top of the polysilicon layer. After the etch back step, about 1600 Å of oxide is left on top of the polysilicon in the trench. After proper implementations for threshold adjustments the first gate oxide of 150 Å is grown.

At this point, the oxide on top of poly in the trench is about 1700 Å and is at the same level as the silicon nitride.

A thick layer of polysilicon is now deposited. The polysilicon is then masked to form thin oxide transistors in the periphery and poly spacers in the cell array. The source of the cell now is formed by the masking and implantation of arsenic. In the following step, all the oxide on top of the polysilicon is dipped off and about 350 Å of an oxide layer is grown in the exposed silicon areas. This oxide layer forms the gate oxide for the control transistor in the cell as well as all the transistors in the periphery that handle voltages larger than 7 volts. FIG. 10 shows how the two polysilicon layers are situated with respect to each other at this point in the process. The exposed portion of the silicon nitride then is etched in hot phosphoric acid and a tunneling oxide layer of 200 Å is grown on the polysilicon.

A third polysilicon layer now is deposited and defined to form the control gate of the cell as well as high voltage transistor gates. After the definition of this poly, the exposed portion of the space will be removed and self-aligns to the control polysilicon layer as is known in the prior art. It might be necessary to use one extra mask during self aligned etching to prevent damage to buried N+ that is used as the source of the cell. This step is followed with an oxidation which seals the sides of the floating polys to prevent charges from leaking out. The rest of the processing steps are very similar to conventional CMOS processes that are well known in the prior art.

A more detailed description of the process relative to the drawings of FIGS. 3 through 11 follows. A semiconductor wafer is used as a substrate. The wafer is masked using any known masking technique.

In the description that follows, where appropriate, each section of the text relating to an individual step of the process illustrated in TABLE I will be begun with the corresponding Roman numeral. I. The wafer is masked to form N-wells of appropriate size and position. The N-Wells are formed through the photoresist mask by implanting a desired dose of N-type contaminants. II. A nitride layer is applied and masked to selectively prevent formation of a field oxide. A field implant to be used as a channel stop is applied to the wafer. III. A field oxidation is selectively grown to 6000 Å over portions of the wafer. IV. The field oxide is masked and selectively removed exposing portions of the substrate. V. Arsenic is implanted through the opening and annealed in subsequent high temperature steps to form the drain. Two drains are formed through each opening.

FIG. 3 shows a cross section of a portion of a wafer at this stage of the process. The cell is formed between the two vertical lines 100 and 102 drawn as reference points only. A thick field oxide layer 106 is formed over a P-type substrate 104. An opening 108 is formed through the field oxide layer 106 which exposes a portion of the substrate 104. A region 110 that will ultimately become the drain to two cells is implanted with Arsenic.

VI. As shown in FIG. 4, a thin layer of nitride ($Si_3N_4$) is deposited over the surface of the structure of FIG. 3. Preferably, this layer is 300 Å thick. VII. Next, a buried contact mask is used to connect the polysilicon bit line to the diffusion. This step can be replaced by a metal connection to the diffusion at a later stage in the process by any conventional technique.

Figure 5:
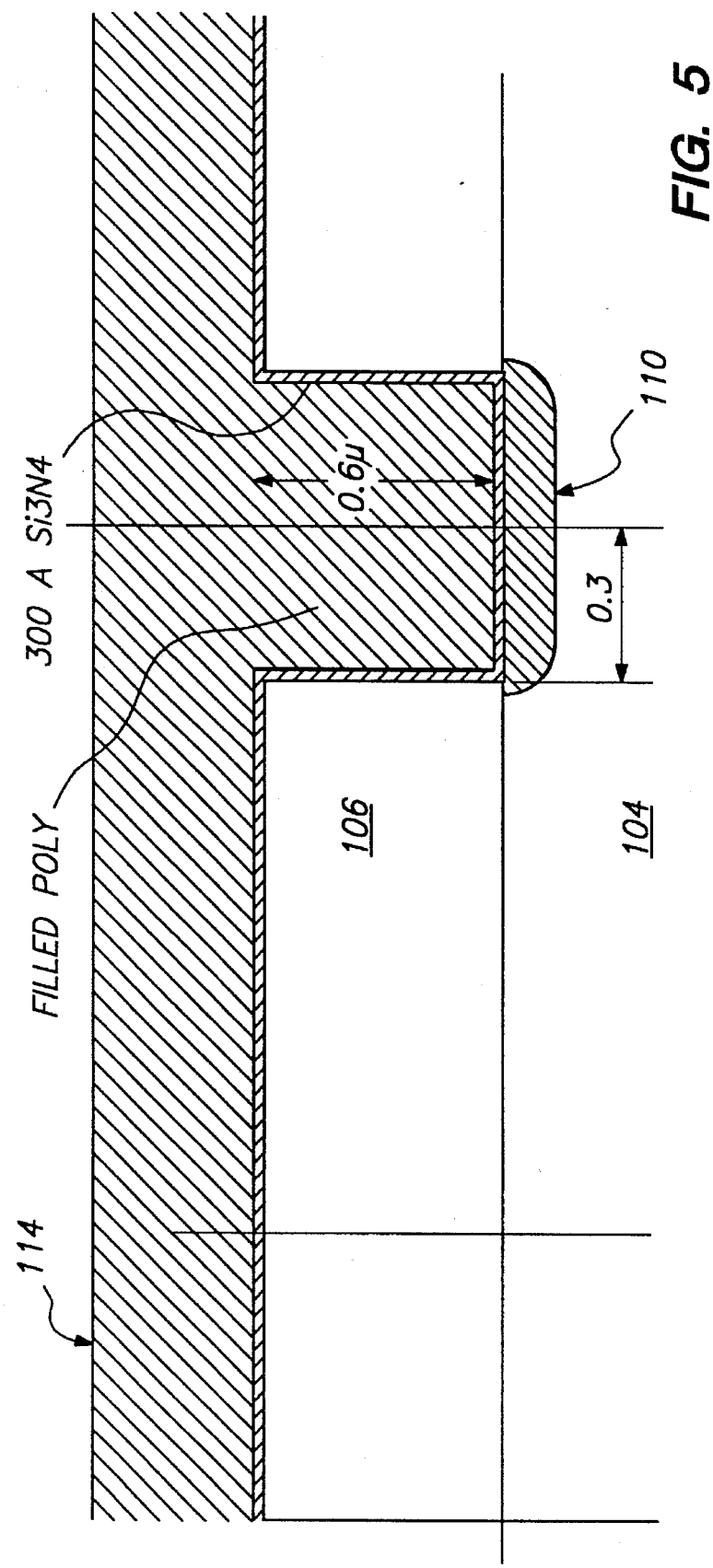

VIII. A first polysilicon layer is then deposited onto the surface of the structure as shown in FIG. 5. The deposited first polysilicon layer should be thicker than 3000 Å so that the surface of the field oxide layer 106 is covered. The first polysilicon layer is doped to be conductive.

Figure 6:
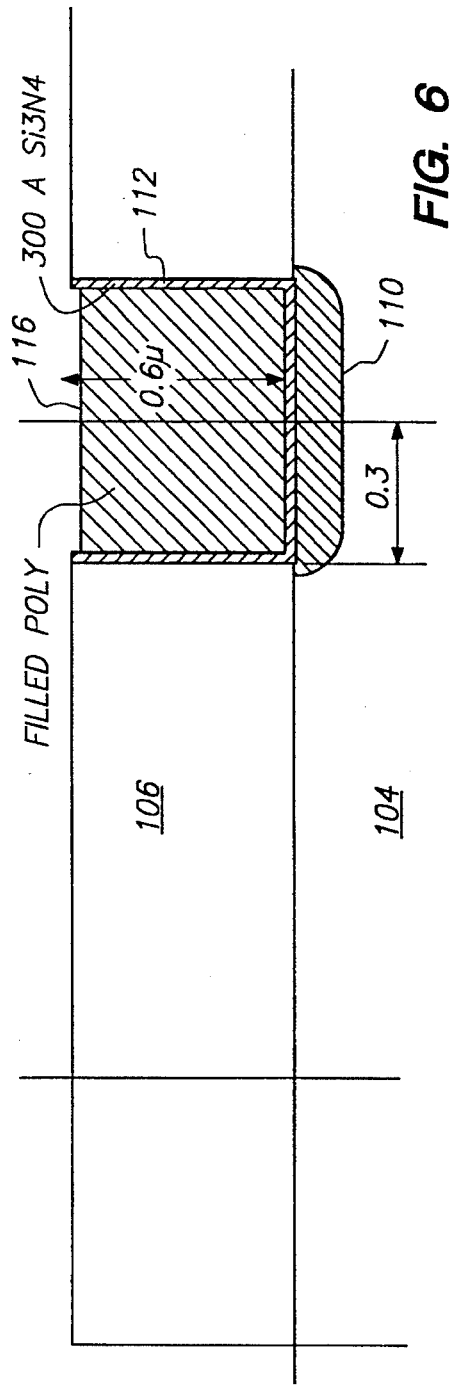
Figure 7:
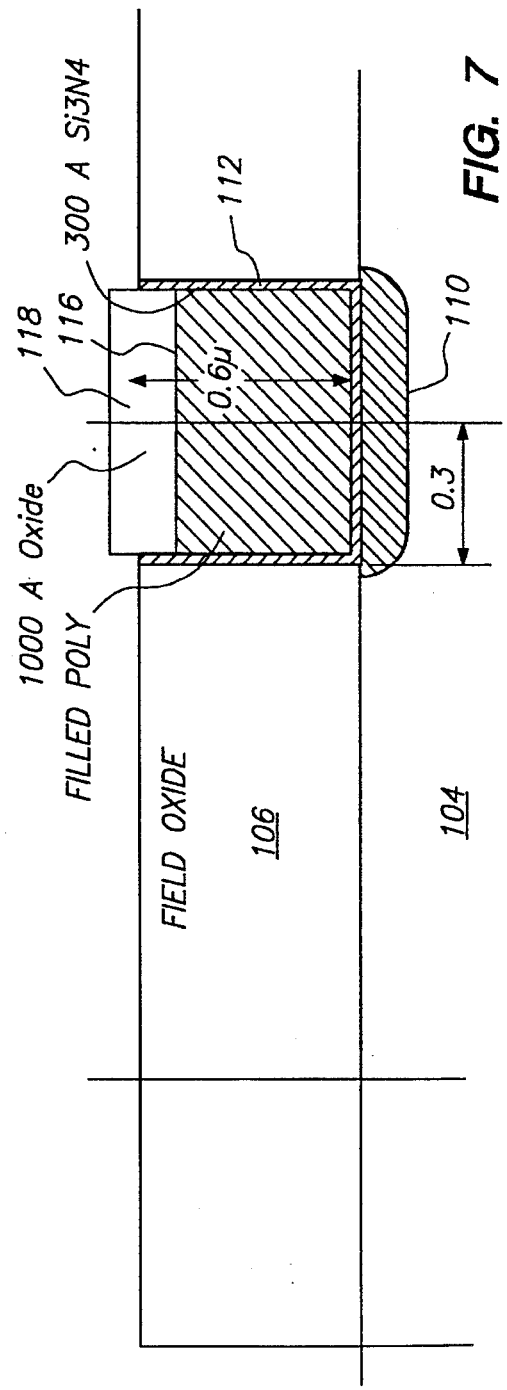

IX. The first polysilicon layer is etched to again expose the surface of the field oxide 106 as shown in FIG. 6 and form a filled polysilicon region 116. X. Next, a 1000 Å oxidation layer 118 is grown as shown in FIG. 7. The growth of the oxidation layer 118 reduces the height of the filled polysilicon region 116.

XI. The wafer is masked, exposing only the cell regions of the circuit. The field oxide is removed by etching the exposed single crystal substrate 104 and the filled polysilicon 116. XII. A sacrificial oxide is grown over the substrate 104 and the filled polysilicon. The thickness of the oxide growth is 850 Å on single crystal silicon and 2600 Å on the filled polysilicon layer 116. XIII. The wafer is then subjected to an 850 Å oxide dip which removes all the oxidation on the substrate 104 and ~950 Å on the filled polysilicon layer 116.

XIV. An implant is performed to adjust the threshold voltage of CMOS transistors. XV. This is followed by growing a first gate oxide layer 122 to a thickness of 150 Å. The oxide layer 118 on the filled polysilicon layer 116 is now approximately 1700 Å as shown in FIG. 8 (note that the Vt adjustment implant is not shown to avoid obscuring the invention with unnecessary detail).

XVI. A second polysilicon layer is deposited. The second polysilicon layer is 3500 Å thick. It is doped to be conductive. XVII. A thin oxide transistor mask is used to define the low voltage CMOS transistors. A plasma etch is used to form the gates of the CMOS transistors as well as the polysilicon spacer 124 along the sidewalls of the nitride layer 112 as shown in FIG. 9.

XVIII. The circuit is masked and a source region 126 is implanted with arsenic. XIX. The oxide is removed from the channel region of the cell by an oxide dip. In the preferred embodiment, the oxide dip is a 30 second 50:1 HF dip. An oxide layer is then grown on this structure including a 325 Å oxide layer 128 is grown over the substrate 104 and a 1000 Å oxide layer 130 is grown over the polysilicon spacer 124 as shown in FIG. 10.

XX. A hot phosphoric nitride etch is used to remove the exposed portion of the nitride layer 112 that is above remaining portions of the filled polysilicon 116 and the oxide layer 118. XXI. A tunneling oxide layer is grown over this structure. The thickness over the substrate is between 50–70 Å so that the gate oxide thickness for the cell is about 350 Å. About 150–200 of oxide is formed over the polysilicon spacer 124 so that the spacing between the floating gate (the space structure) and the control gate (not yet formed) is about 1000 Å as shown in FIG. 11. Note that a thin oxide layer is formed over the vertical sidewall of the floating gate.

XXII. A third polysilicon layer is formed over the structure of FIG. 11. XXIII. The third polysilicon layer is masked and XXXIV the mask is removed. The third poly silicon layer follows the contour of the floating gate so that it is spaced apart from the floating gate about 1000 Å along the curved surface that is oriented away from the substrate 104. The spacing between the floating gate and the control gate is only about 200 Å along the short length of overlap along the vertical sidewall. The amount of the overlap between the floating gate and the control gate is about 700 Å. After the definition of Poly 3 and etching it, a self align mask is used to cover the periphery as well as the source of the cell. Using this mark the 1000 Å on to P of the floating Poly 42 and bit line 46 will be etched off. Using a non-vertical poly etch then the spacer 42 is removed from in between the control gates. During this etch about 3000 Å of poly will be etched away from the polysilicon filled bit lines leaving about 2000 Å of poly in the bit lines in between the control gates.

The remainder of the steps in the process (XXXV through XXXXII) are for forming portions of the circuit separate and apart from the cell. The steps listed in TABLE I are representative of conventional steps for forming those steps and included only for completeness. A person of ordinary skill in the art would readily be able to develop other steps for forming those desired structures and circuits.

The present invention has been described relative to a preferred embodiment. It will be readily understood that the thicknesses and specific processing steps can and will vary according to the precise needs of any particular circuit design and process requirements. Such modifications which become apparent to a person of ordinary skill in the art only after reading this disclosure are deemed within the spirit and scope of this invention and the appended claims.

TABLE I

Spacer Flash cell process

| | |
|---|---|
| I. | N-Well mask/process/implants. |
| II. | Diff. mask/Nitride etch/Field implant. |
| III. | Field Oxidation 6000Å. |
| IV. | Poly bit line mask/plasma etch. |
| V. | As implant/remove resist. |
| VI. | Nitride Deposition. |
| VII. | Buried contact mask (to connect poly bit line to diff.) |
| VIII. | Poly fill/poly dope. |
| IX. | Poly etch back. |
| X. | Oxidation 1000Å. |
| XI. | Field Oxide etch mask. |
| XII. | Sacrificial oxide growth: 850Å on single crystal silicon. On poly 2600Å. |
| XIII. | Oxide dip 850 A (total oxide removed ~950Å. |
| XIV. | Vt adjustment implants. |
| XV. | Gate oxide 1 150Å. (oxide on the poly 1700Å). |
| XVI. | Poly 2 deposition 3500Å/dope. |
| XVII. | Thin oxide transistor mask + spacer formation. |
| XVIII. | As implant mask/As implant. |
| XIX. | Oxide dip/Grow gate oxide: gate oxide (high voltage) 300Å (900Å on poly) |
| XX> | Hot Phosphoric Nitride etch. |
| XXI. | Tunneling oxide: 70Å on silicon 200Å on poly (total gate oxide 350, total poly oxide 1000Å). |
| XXII. | Poly 3 deposition/dope. (poly side) |
| XXIII. | Poly 3 mask. |
| XXIV. | Poly 3 removal self align mask/poly etch. |
| XXV. | LDD Ph. implant mask/Ph. implant. |
| XXVI. | Spacer oxide deposition. |
| XXVII. | Spacer etch. |
| XXVIII. | N+ S/D implant mask/As implant. |
| XXIX. | P+ S/D implant mask/Boron implant. |
| XXX. | S/D oxidation. |
| XXXI. | BPSG deposition. |
| XXXII. | Contact mask. |
| XXXIII. | Ti sputter/Nitradization. |
| XXXIV. | Metal 1 dep. |
| XXXV. | Metal 1 mask/etch. |
| XXXVI. | ILD deposition. |
| XXXVII. | Planarization. |
| XXXVIII. | Via mask/via etch. |
| XXXIX. | Metal 2 dep. |
| XXXX. | Metal 2 mask/etch. |
| XXXXI. | Passivation. |
| XXXXII. | Pad mask. |

I claim:

1. A nonvolatile memory cell comprising:

a. a planar substrate of a semiconductor material having an upper surface and further having a conductive source region and a conductive drain region formed in the upper surface having a channel region therebetween;

b. a floating gate that is coupled to the substrate, wherein the floating gate is formed of a conductive material that is surrounded by an electrically insulating material and further wherein the floating gate has a cross section which is longer along one axis than it is along its other axis, the floating gate having at least one surface parallel to the longer axis that is substantially perpendicular to the substrate, the floating gate having a sharp tip at an end of the surface furthest from the substrate wherein the floating gate is positioned over and electrically controls only a portion of the channel adjacent the drain; and c. a control gate, coupled to the substrate so that the floating gate is between the control gate and the substrate, wherein the control gate is spaced apart from the floating gate by the insulating material such that the control gate only overlaps a portion of the floating gate along the at least one surface parallel to the longer axis that is substantially perpendicular to the substrate furthest from the substrate and only comes into close proximity with the floating gate in this region of overlap wherein the control gate is positioned over the channel and electrically controls only that portion of the channel not controlled by the floating gate, such that the channel is split into two portions wherein a first portion of the channel is controlled by the floating gate and a second portion of the channel is controlled by the control gate and further wherein the floating gate is programmed by hot electron injection from a weakly conducting second portion.

2. The memory cell according to claim 1 wherein the cell is electrically erasable.

3. The memory cell according to claim 2 wherein the cell is erased through the insulating material where the control gate comes into close proximity with the sharp tip of the floating gate.

4. The memory cell according to claim 1 wherein the substrate is formed of single crystal silicon.

5. The memory cell according to claim 1 wherein the floating gate is formed of doped polysilicon.

6. The memory cell according to claim 1 wherein the control gate is formed of doped polysilicon.

7. The memory cell according to claim 1 wherein the insulating material is formed of $Si_3N_4$ along a portion of the surface of the floating gate that is substantially perpendicular to the substrate and formed of $SiO_2$ elsewhere.

8. The memory cell according to claim 1 wherein the distance between the floating gate and the control gate in the region of the sharp tip of the spacer overlap is approximately 200 Å and approximately 1000 Å elsewhere.

9. A nonvolatile memory cell comprising:

a. a planar substrate of a semiconductor material having a surface, wherein the substrate is doped to a first conductivity type having a drain region and a source region space apart from one another and formed within the surface forming a channel therebetween;

b. a first conductive material having at least one planar first sidewall substantially perpendicular to the substrate, wherein the first conductive material is formed over the drain region and spaced apart from the drain by a first insulating layer wherein the first insulating layer includes a substantially planar second insulating layer along the first sidewall that is coupled to the first insulating layer;

c. a second conductive material having a substantially planar second sidewall, wherein the second conductive material is formed over the substrate and adjacent to the first conductive material and between the drain and the source regions but spaced apart from the source region such that the second sidewall is coupled to the second insulating layer and further wherein the second conductive material is surrounded by a third insulating layer and wherein the second conductive material extends further from the substrate than the first conductive material leaving an exposed and insulated portion of the second sidewall wherein the second conductive material covers and electrically controls only a portion of the channel adjacent the drain; and d. a third conductive material formed over the substrate and extending from the source region to the drain region such that the second conductive material is between the third conductive material and the substrate such that the third conductive material is spaced apart from the second conductive material by a first distance along a surface of the second conductive material away from the substrate and the second sidewall and a second distance along the exposed and insulated portion of the second sidewall wherein the second distance is less than the first distance wherein the third conductive material covers the channel but only electrically controls that portion of the channel not covered by the second conductive material, such that the channel is split into two portions wherein a first portion of the channel is controlled by the second conductive material and a second portion of the channel is controlled by the third conductive material and further wherein the second conductive material receives electrons through hot electron injection from a weakly conducting second portion.

10. The memory cell according to claim 9, wherein the first conductive material is doped polysilicon, the second conductive material is doped polysilicon and the third conductive material is doped polysilicon.

11. The memory cell according to claim 9 wherein the first conductive material is electrically coupled to the drain.

12. The memory cell according to claim 9 wherein the first insulating layer and the second insulating layer are formed of $Si_3N_4$.

13. The memory cell according to claim 9 wherein the third insulating layer is $SiO_2$.

14. The memory cell according to claim 9 wherein the first distance is approximately 1000 Å and the second distance is approximately 200 Å.

15. The memory cell according to claim 9 wherein a capacitive coupling between the first conductive material and the second conductive material is approximately 0.75 and the capacitive coupling between the second conductive material and the third conductive material is approximately 0.15.

16. The memory cell according to claim 9 wherein the cell cannot over erase.

* * * * *

UNITED STATES PATENT AND TRADEMARK OFFICE
CERTIFICATE OF CORRECTION

PATENT NO. : 5,479,368

DATED : Dec. 26, 1995

INVENTOR(S) : Parviz Keshtbod

It is certified that error appears in the above-identified patent and that said Letters Patent is hereby corrected as shown below:

In column 3, line 10, ".channel" should have been typed --channel --.

In column 4, line 46, "operation-of" should have been typed --operation of--.

In column 5, lines 24 and 25, "The Preferred Process for Forming the Flash Cell in Combination with a CMOS Process" should have been typed --The preferred process for forming the Flash Cell in combination with a CMOS process.--

Signed and Sealed this

Fourteenth Day of May, 1996

Attest:

BRUCE LEHMAN

*Attesting Officer*     *Commissioner of Patents and Trademarks*